US008892387B2

United States Patent
Bruzzano et al.

(10) Patent No.: US 8,892,387 B2
(45) Date of Patent: Nov. 18, 2014

(54) DRIVING CIRCUIT OF A TEST ACCESS PORT

(75) Inventors: Enrico Bruzzano, Naples (IT); Antonio Anastasio, Villaricca (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 393 days.

(21) Appl. No.: 13/240,163

(22) Filed: Sep. 22, 2011

(65) Prior Publication Data

US 2012/0150477 A1    Jun. 14, 2012

(30) Foreign Application Priority Data

Dec. 10, 2010   (IT) ............... MI2010A2265

(51) Int. Cl.
| | |
|---|---|
| *G01R 31/26* | (2014.01) |
| *G01R 31/00* | (2006.01) |
| *G01R 31/02* | (2006.01) |
| *G06F 3/00* | (2006.01) |
| *G01R 31/3185* | (2006.01) |
| *G11C 29/32* | (2006.01) |
| *G11C 29/48* | (2006.01) |

(52) U.S. Cl.
CPC ........ *G01R 31/318555* (2013.01); *G11C 29/32* (2013.01); *G11C 29/48* (2013.01); *G01R 31/318572* (2013.01); *G01R 31/318536* (2013.01)
USPC ............ 702/120; 702/117; 702/118; 702/179

(58) Field of Classification Search
USPC ......... 702/117, 118, 120, 179, 183; 324/73.1; 714/745
See application file for complete search history.

(56) References Cited

U.S. PATENT DOCUMENTS

| | | | | |
|---|---|---|---|---|
| 4,860,290 | A | | 8/1989 | Daniels et al. .................. 371/25 |
| 4,862,072 | A | * | 8/1989 | Harris et al. .................. 324/73.1 |
| 5,737,342 | A | * | 4/1998 | Ziperovich .................... 714/736 |
| 6,301,190 | B1 | * | 10/2001 | Tsujino et al. ........... 365/233.12 |
| 7,007,215 | B2 | * | 2/2006 | Kinoshita et al. ............. 714/745 |
| 2009/0309609 | A1 | | 12/2009 | De Jong et al. ............... 324/537 |

FOREIGN PATENT DOCUMENTS

WO     2010/035238     4/2010     ........ G01R 31/3185

* cited by examiner

*Primary Examiner* — Eliseo Ramos Feliciano
*Assistant Examiner* — Felix Suarez
(74) *Attorney, Agent, or Firm* — Allen, Dyer, Doppelt, Milbrath & Gilchrist, P.A.

(57) ABSTRACT

A driving circuit of a test access port is disclosed. The driving circuit includes an input terminal for receiving a first test data signal when the driving circuit is operating in an external test mode. The driving circuit is configured to receive a second test data signal (BS) carrying a test command to be executed on the test access port when the driving circuit is operating in an internal test mode. The driving circuit comprises a control logic circuit configured for processing the test command and generating therefrom an internal test data signal carrying the processed test command when the driving circuit is operating in the internal test mode. The driving circuit includes a selector configured for generating a selected test data signal, the selected test data signal being selected from the first test data signal when the driving circuit is operating in the external test mode.

20 Claims, 3 Drawing Sheets

DRIVING CIRCUIT OF A TEST ACCESS PORT

FIELD OF THE INVENTION

The present invention generally relates to the field of the test of electronic circuits. More particularly, the present invention relates to a driving circuit for a test access port.

BACKGROUND OF THE INVENTION

The JTAG (Joint Test Action Group) standard is defined by the recommendation IEEE 1149.1 and is widely used to test parts of an integrated circuit or the whole integrated circuit. The JTAG standard has the advantage that it allows the performance of the test without using a direct physical access to the integrated circuit. This is achieved by using three external input terminals to receive three input test signals indicated with TDI, TMS, TCK, and an output external terminal to generate an output test signal indicated with TDO. The TDI, TMS, TCK, TDO signals are received by an interface included into the integrated circuit. The interface is referred to as Test Access Port (TAP).

An IEEE Work Group has proposed a method for connecting, accessing, analyzing and describing test functions within the integrated circuit. Such a method is disclosed in the IEEE P1687 standard proposal, also known as Internal JTAG (IJTAG). The Applicant has observed that the JTAG standard has the disadvantage that it allows access to the Test Access Port only by means of terminals external to the integrated circuit.

SUMMARY OF THE INVENTION

The present invention relates to a driving circuit for a test access port. The Applicant has recognized that the driving circuit according to the present invention can allow access to the Test Access Port from the inside of the integrated circuit, such as, for example, by a program running on a micro-processor within the integrated circuit. This has the following advantages.

The time wherein the operation of the whole, or of part of the, integrated circuit to be tested is stopped can be reduced. Reading/writing from or to the registers of the Test Access Port is also possible when the external terminals of the test signals are not available. A protocol may be defined to access the registers of the Test Access Port, allowing or blocking the read from and/or the write to the same registers. In addition, it may be possible to use the external terminals of the test signals to perform further functions.

It is therefore an object of the present invention to provide system to test a digital circuit. It is a further object of the present invention to also provide an integrated circuit. It is a further object of the present invention to provide a method for driving a test access port.

BRIEF DESCRIPTION OF THE DRAWINGS

Further characteristics and the advantages of the invention will be clear from the following description of a preferred embodiment and variants thereof provided as a way of example with reference to the appended drawings, wherein.

DETAILED DESCRIPTION OF THE PREFERRED EMBODIMENTS

Figure 1:
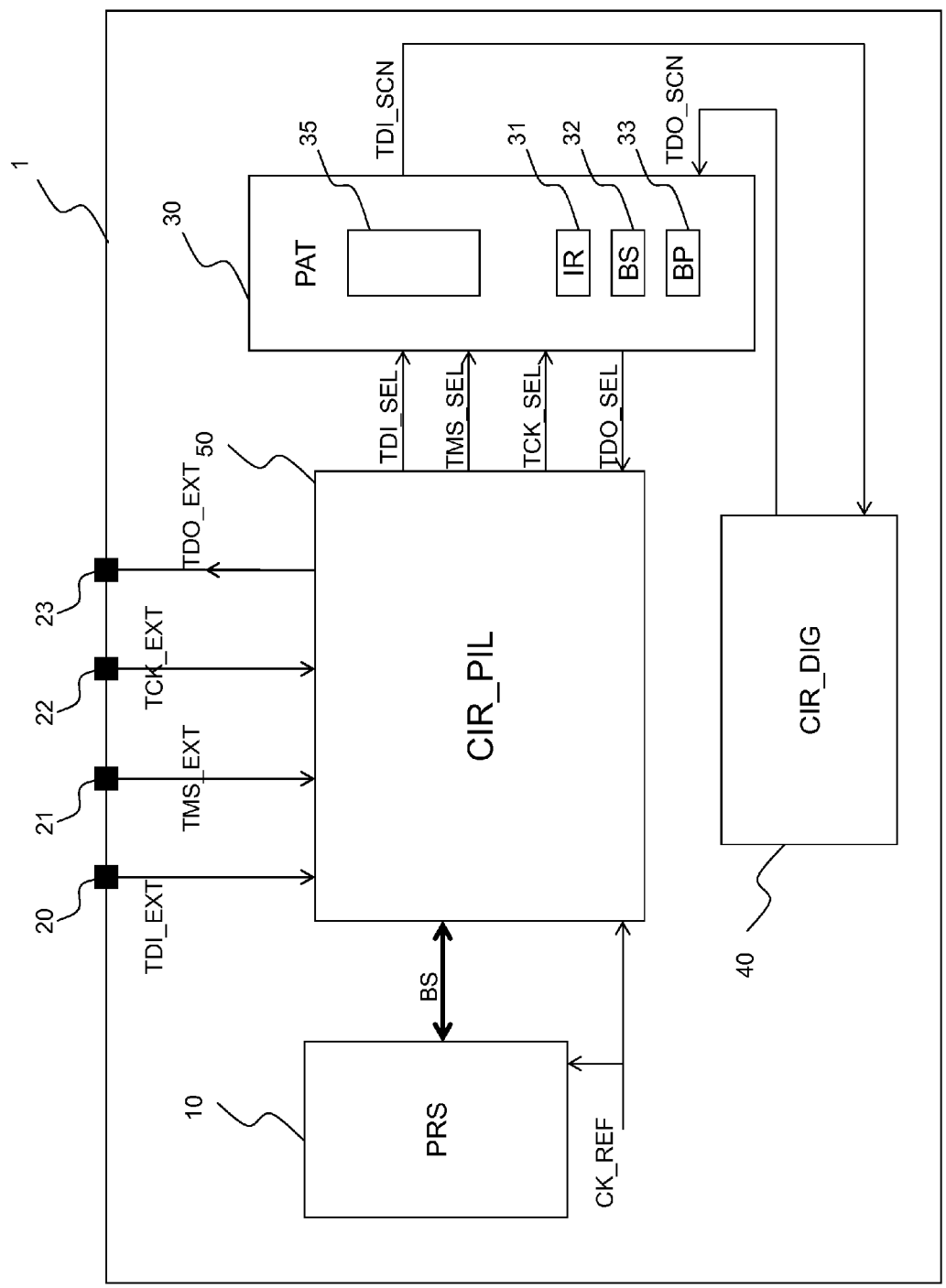
FIG. 1 schematically shows a system to test a digital circuit according to an embodiment of the invention.

Referring to FIG. 1, a system 1 to test a digital circuit 40 according to an embodiment of the invention is now described. The system 1 includes a micro-processor 10 (PRS), a digital circuit 40 (CIR_DIG), a bus BS which connects the micro-processor 10 to the digital circuit 40 by means of a pre-defined protocol, a driving circuit 50 (CIR_PIL), a Test Access Port 30 (PAT), input terminals 20, 21, 22 and output terminal 23.

The system 1 may be part of an integrated circuit or may be the same as the whole integrated circuit. Therefore the micro-processor 10, the digital circuit 40, the driving circuit 50 and the Test Access Port 30 are placed within the same integrated circuit. In case the system 1 is the same as the whole integrated circuit, the terminals 20, 21, 22, 23 are the pins of the integrated circuit.

The driving circuit 50 may be a specific or programmable integrated circuit (for example a FPGA=Field Programmable Gate Array) and may be realized by means of a programming language such as for example VHDL (Very high-speed integrated circuit Hardware Description Language) or Verilog.

Terminals 20, 21, 22 are to receive an external test data signal TDI_EXT, an external test mode state signal TMS_EXT, an external test clock signal TCK_EXT respectively and are to generate an external test signal TDO_EXT. Preferably, the external test signals are four, referred to as TDI_EXT, TMS_EXT, TCK_EXT, TDO_EXT and they are those defined in the standard IEEE 1149.1, wherein they are referred to as TDI (Test Data In), TMS (Test Mode State), TCK (Test Clock), TDO (Test Data Out) respectively. More in general, the system 1 includes at least the input terminal 20 for receiving the external test data signal TDI_EXT and the invention may be applied also to other types of tests different from the standard IEEE 1149.1.

The micro-processor 10 is to transmit over the bus BS one or more test commands indicating one or more operations to be performed on the Test Access Port 30 (e.g. accessing the registers of the Test Access Port 30). The micro-processor 10 is also to transmit over the bus BS a sequence of pre-defined values in a pre-defined time order to indicate the selection from the inside of the system 1 of the data required to perform the test of the digital circuit 40 (as it will be explained more in detail afterwards), is to read from bus BS data indicating the result of the test performed on the digital circuit 40.

The micro-processor 10 is also to run a program realized by software code to generate the test commands in order to perform the test of the digital circuit 40 (for example, test of the "boundary scan" type, "internal scan", LBIST—Logic Built In Self Test—or MBIST—Memory Built In Self Test). The micro-processor 10 is also to generate the sequence of pre-defined values in a pre-defined time order to indicate the selection from the inside of the system 1 of the data required to perform the test of the digital circuit 40 and is to perform a check of the result of the performed test in order to verify whether the test of the digital circuit 40 has had a positive result.

Preferably, the micro-processor 10 is to transmit over the bus BS, according to the pre-defined protocol, the test commands which are the values to be written into the instruction register IR and into the data register DR as defined in the standard IEEE 1149.1, as will be explained more in detail afterwards.

The driving circuit 50 is to operate according to a stand-by mode, according to an external test mode and according to an internal test mode. In particular, in the stand-by mode the driving circuit 50 is inactive. In addition, in the external test mode the driving circuit 50 has the function of allowing the access to the registers (31, 32, 33) inside the Test Access Port 30 by means of the external test signals TDI_EXT, TMS_EXT, TCK_EXT, TDO_EXT. In addition, in the internal test mode the driving circuit 50 has the function of allowing the access to the registers (31, 32, 33) inside the Test Access Port 30 from the micro-processor 10.

The driving circuit 50 comprises first, second and third input terminals to receive the external test data signal TDI_EXT, the external test mode state signal TMS_EXT and the external test clock signal TCK_EXT respectively, when the driving circuit 50 is to operate according to the external test mode. An output terminal is to generate the external test signal TDO_EXT, when the driving circuit 50 is to operate according to the external test mode. One or more input/output terminals are connected to the bus BS.

The input terminal is to receive a reference clock signal CK_REF, which is the clock signal used for the operation of the integrated circuit of which the system 1 is part (and also used by the micro-processor 10) and generated by means of an oscillator or a PLL. First, second and third output terminals generate a selected input test data signals TDI_SEL, a selected test mode state signal TMS_SEL, and a selected test clock signal TCK_SEL respectively, when the driving circuit 50 is operating according to the internal test mode. An input terminal receives a selected output test data signal TDO_SEL indicating the result of the test performed on the digital circuit 40, when the driving circuit 50 is operating according to the internal test mode.

When the driving circuit 50 operates according to the external test mode, the driving circuit 50 is to receive the external test signals TDI_EXT, TMS_EXT, TCK_EXT and is to generate over the first output terminal the selected input test data signal TDI_SEL equal to the external test data signal TDI_EXT. The driving circuit 50 is to generate over the second output terminal the selected test mode state signal TMS_SEL equal to the external test mode state signal TMS_EXT and to generate over the third output terminal the selected test clock signal TCK_SEL equal to the external test clock signal TCK_EXT.

When the driving circuit 50 operates according to the internal test mode, the driving circuit 50 is to receive from the bus BS a pre-defined sequence of values in a pre-defined time order, the sequence indicating the selection from the inside of the system 1 of the data required to perform the test of the digital circuit 40. The driving circuit 50 is also to receive from the bus BS a signal carrying one or more test commands to be performed on the Test Access Port 30, such as the access to the registers inside the Test Access Port 30. The driving circuit 50 is also to generate over the first output terminal the selected input test data signal TDI_SEL equal to an internal input test data signal TDI_INT generated internally to the driving circuit 50, as it will be explained more in detail afterwards. The driving circuit 50 is also configured to generate over the second output terminal the selected test mode state signal TMS_SEL equal to an internal test mode state signal TMS_INT generated internally to the driving circuit 50, as it will be explained more in detail afterwards. The driving circuit 50 is additionally configured to generate over the third output terminal a selected test clock signal TCK_SEL equal to an internal test clock signal TCK_INT generated internally to the driving circuit 50, as it will explained more in detail afterwards, and to generate over the bus BS data indicating the result of the performed test.

It has to be observed that the connection between the micro-processor 10 and the driving circuit 50 implemented with the bus BS is only an exemplary embodiment, and that other variations are possible which use one or more terminals (which carry one or more signals) which connect the micro-processor 10 with the driving circuit 50.

More in general, the driving circuit 50 includes at least one input terminal for receiving at least one external test data signal, at least one further input terminal for receiving at least one test command to be performed on the Test Access Port 30, and at least an output terminal to generate at least one selected test data signal.

The Test Access Port 30 includes a controller 35 (implemented with a finite state machine) and one or more registers 31, 32, 33, and allows the testing of the digital circuit 40. The Test Access Port 30 includes three input terminals for receiving the selected input test data signal TDI_SEL, the selected test mode state signal TMS_SEL, and the selected test clock signal TCK_SEL, an output terminal for generating the selected output test data signal TDO_SEL, an output terminal for generating an input scan data signal TDI_SCN, and an input terminal for receiving an output scan data signal TDO_SCN.

The Test Access Port 30 receives the selected input test data signal TDI_SEL which carries one or more test commands to be performed on the Test Access Port 30, and the Test Access Port 30 generates the input scan data signal TDI_SCN in order to perform the test of the digital circuit 40.

Preferably, the Test Access Port 30 operates as defined in the standard IEEE 1149.1, wherein it is referred to as TAP (Test Access Port). In this case, the Test Access Port 30 includes the instruction register 31 (referred to as IR) to operate as a shift register, and includes at least the data registers 32 (BS), 33 (BP) (referred to as DR) which are the boundary scan register and the by-pass register respectively, to operate as shift registers. Moreover, the test command received and executed on the Test Access Port 30 is, for example, a write (or read) operation of the instruction register 31 or a write (or read) operation of one of the data registers 32, 33, in order to perform the test of the digital circuit 40.

It is to be observed that the invention may be applied also to other types of tests different from the standard IEEE 1149.1 and so the Test Access Port 30 includes at least an input terminal to receive at least one selected test signal.

When the digital circuit 40 operates according to a normal operating mode, it is to perform a generic logic function of the combinatorial and/or sequential type and is to operate according to a test mode wherein the test of the operation of the digital circuit 40 is performed. Preferably, in the test mode the digital circuit 40 is configured that in a normal operation condition, the digital circuit 40 is to perform a logic function of the combinatorial and/or sequential type. In a shift register condition wherein one or more scan chains are configured (also of a different length) internally to the digital circuit 40, wherein each scan chain includes one or more flip flops and is functionally equivalent to a shift register of a dimension equal to the number of flip flops of the chain, the flip flops are the same which are used (when the digital circuit 40 is in the normal operating mode) to implement the generic logic function of the sequential type in the digital circuit 40.

The digital circuit 40 comprises an input scan terminal for receiving, when the driving circuit 50 is in the internal or external test mode, the input scan data signal TDI_SCN and includes an output scan terminal to generate the output scan data signal TDO_SCN.

Preferably, the digital circuit 40 in the shift register condition of the test mode includes at least one scan chain connected between the input scan terminal and the output scan terminal, as defined in the standard IEEE 1149.1 in order to allow to perform the test of the digital circuit 40. It has to be observed that the invention may be applied also to other types of tests different from the standard IEEE 1149.1.

Figure 2:
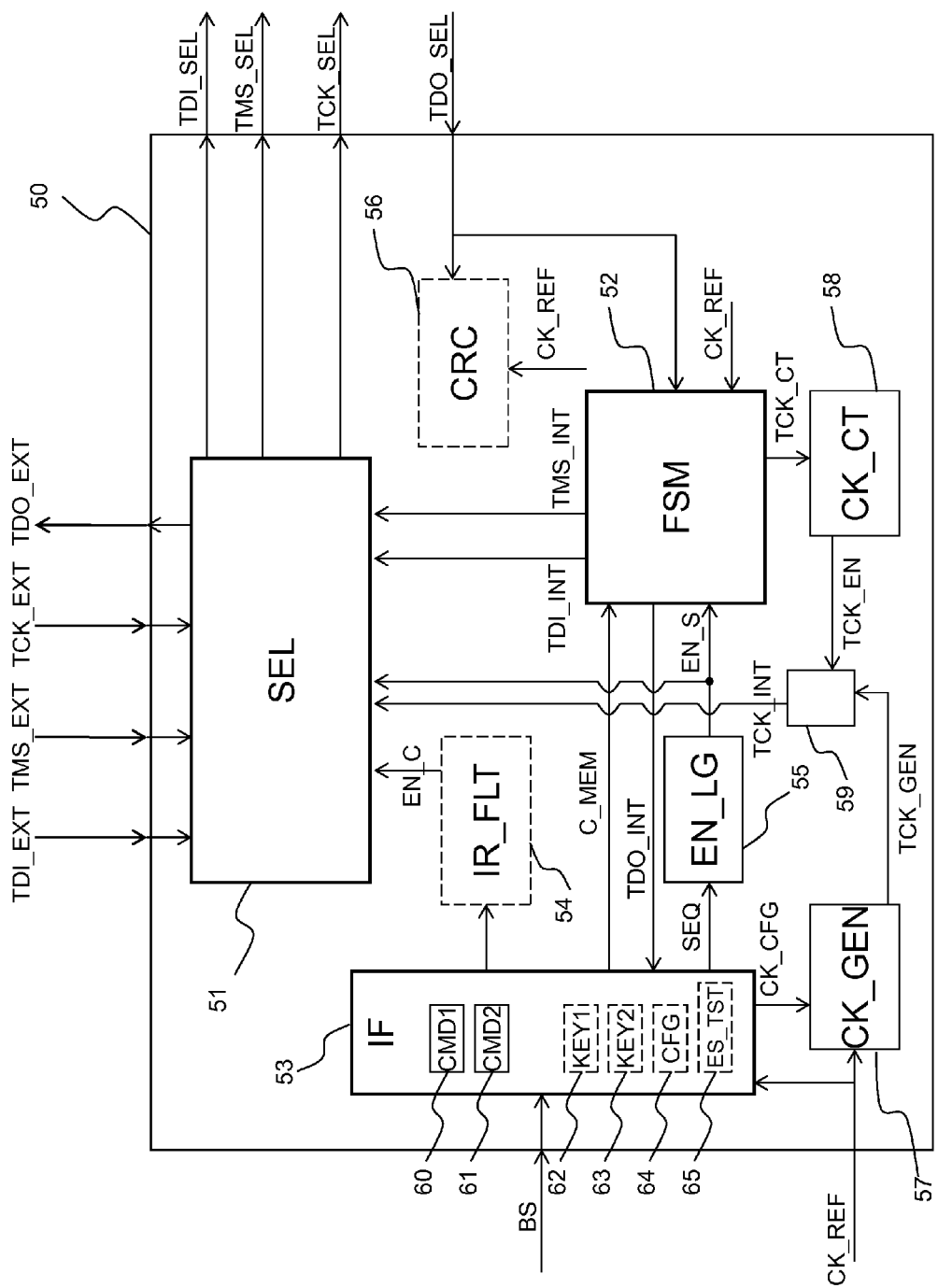
FIG. 2 schematically shows a driving circuit of a Test Access Port according to an embodiment of the invention.

Referring to FIG. 2, it the driving circuit 50 according to the embodiment of the invention is shown in greater detail. The driving circuit 50 includes a bus interface module 53 (IF), an enable logic circuit 55 (EN_LG), a control logic circuit 52 (FSM), a selector 51 (SEL), a programmable clock signal generator 57 (CK_GEN), a clock enable control module 58 (CK_CT), and a clock gating 59.

The bus interface module 53 includes a plurality of registers, in particular a command register 60 (CMD1) to store the type of the test command to be executed on the Test Access Port 30, such as for example a read or write operation of the instruction register 31 or of one of the data registers 32, 33 of the Test Access Port 30. The bus interface module 53 also includes a data register 61 (CMD2) to store further data required to perform the test command, such as the values to be written into the instruction register 31 or into one of the data registers 32, 33 of the Test Access Port 30. The bus interface module 53 also includes two protection registers 62 (KEY1), 63 (KEY2) such to store a pre-defined sequence of values in a pre-defined order, in order to protect the access to the driving circuit 50 and thus to protect the access to the registers of the Test Access Port 30.

The bus interface module 53 is configured to read from the bus BS the pre-defined sequence of values in a pre-defined time order, the sequence indicating the selection from the inside of the system 1 of the data required to perform the test of the digital circuit 40. The bus interface module 53 is also configured to process the sequence of pre-defined values, and store the sequence of values into the protection registers 62, 63 contained into the bus interface module 53.

Moreover, the bus interface module 53 is configured to read from the bus BS one or more test commands according to the pre-defined protocol, wherein the test commands are indicating one or more operations to be executed on the Test Access Port 30, such as writing the registers of the Test Access Port 30, processing the test commands, storing the test commands into the command register 60 and into the data register 61 of the bus interface module 53, and generating as output a stored command signal C_MEM.

Preferably, the bus interface module 53 further includes a test result register 65 (ES_TST) for storing the data, received in parallel by means of an internal output test data signal TDO_INT, relating to the result of the test performed on the digital circuit 40. In this case, the bus interface module 53 is configured to further receive the internal output test data signal TDO_INT indicating the result of the test performed on the digital circuit 40, to store the values of the internal output test data signal TDO_INT into the test result register 65, and to transmit over the bus BS the values stored into the test result register 65. Moreover, the micro-processor 10 is to read, by means of the bus BS, the value stored into the test result register 65 and to verify whether it is equal to an expected value. If so, the test of the digital circuit 40 has had a positive result, otherwise it has had a negative result, for example due to a failure inside the digital circuit 40.

The enable logic circuit 55 has the function of protecting the access to the driving circuit 50 from the micro-processor 10 and thus it has the function of protecting the access to the registers of the Test Access Port 30 from the micro-processor 10. In particular, the enable logic circuit 55 is configured to read, by means of a sequence signal SEQ, the sequence of values stored into the protection registers 62, 63 of the bus interface module 53 and indicative of the selection from the inside of the system 1 of the data required to perform the test of the digital circuit 40. The enable logic circuit 55 is also configured to control whether the sequence of the stored values is equal to a sequence of the expected values and, in case of a positive result, and to generate a process enable signal EN_S having for example a high logic value for indicating the activation of the internal test mode for the driving circuit 50, wherein the selection from the inside of the system 1 of the data used to perform t test of the digital circuit 40 is performed, and having a low logic value to indicate the external test mode or the stand-by mode for the driving circuit 50. it this way it is possible to protect the access to the driving circuit 50 from the micro-processor 10, for example helping to prevent spurious accesses. The process enable signal EN_S is to have a transition from the high to the low logic value in case the test system 1 receives an external reset signal (for example, in case of a switch-off of the test system 1).

Preferably, the command register 60 contains at least the following fields. INST1_DATA0, comprising one bit and having a low logic value for indicating a write operation into one of the data registers 32, 33 of the Test Access Port 30. INST1_DATA0 also has a high logic value for indicating a write operation into the instruction register 31 of the Test Access Port 30. PULSE_NUM comprises a number of bits used for representing the value to be written into the instruction register 31 of the Test Access Port 30 (i.e. the number of bits to be loaded into the instruction register 31) or for indicating the number of bits required to represent the value to be written into one of the data registers 32, 33 of the Test Access Port 30 (i.e. the number of bits to be loaded into one of the data registers 32, 33).

START_FSM (start field) includes one bit that has a transition from the low to the high logic value for indicating the beginning of the execution of the test command to be executed on the Test Access Port 30 and has a transition from the low to the high logic value for indicating the completion of the execution of the test command. TST_LG_RST (reset field) includes one bit that has a transition from the low to the high logic value for generating the Test Logic Reset sequence, comprising five strokes [colpi] of the internal clock signal TCK_INT and of a high logic value of the internal test mode state signal TMS_INT.

The micro-processor 10 is configured to write the high logic value into the field START_FSM for indicating the beginning of the execution of the test command to be executed on the Test Access Port 30 and is configured to monitor the field START_FSM to detect the transition from the high to the low logic value indicating the completion of the execution of the test command. Therefore the driving circuit 50 during the internal test mode operates independently from the micro-processor 10. This allows the micro-processor 10 to continue to operate (i.e. it may continue to perform operations different from those connected to the test of the digital circuit 40) in the time interval wherein the driving circuit 50 (and thus the finite state machine 100) is to operate in the internal test mode wherein it performs the test of the digital circuit 40. Moreover, it allows reduction of the time used to perform the test of the digital circuit 40.

Preferably, the bus interface module 53 further comprises a configuration register 64 (CFG) having a value that may be modified and which is used for the operation of the driving circuit 50. Preferably, the configuration register 64 contains a field TCK_DIV including 2 bits indicative of the division factor to be used for the reference clock signal CK_REF. This allows use of the reference clock signal CK_REF for the operation of the integrated circuit of which the system 1 is part, also for the operation of the control logic circuit 52 (in particular, for the operation of the finite state machine 100) and also allows use of the selected test clock signal TCK_SEL (obtained from the reference clock signal CK_REF by means of the division by a proper value of the division factor and thus at a lower frequency) for the operation of the Test Access Port 30 (in particular, for the operation of the finite state machine 35). In this way the operation of the Test Access Port 30 (in particular, of the finite state machine 35) is independent from the reference clock signal CK_REF.

The control logic circuit 52 is configured to receive the reference signal CK_REF, to receive the process enable signal EN_S, to read, by means of the stored command signal C_MEM, the test commands stored into the registers of the bus interface module 53 and, in the case wherein the process enable signal EN_S has a high logic value, it configured to perform the processing of the test command and provide as an output the internal input test data signal TDI_INT which carries the processed test command, to provide as an output the internal test mode state signal TMS_INT and provide as an output an internal clock control signal TCK_CT.

Moreover, the control logic circuit 52 is configured to receive serially the selected output test data signal TDO_SEL, to generate the internal output test data signal TDO_INT in a parallel format which carries blocks of bits (e.g. 32 bits) of the selected output test data signal TDO_SEL, and to store the blocks of bits of the internal output test data signal TDO_INT into the test result register 65.

Advantageously, the control logic circuit 52 is implemented with a finite state machine 100, as it will be explained afterwards in the description of FIG. 3. The selector 51 has the function of generating the selected input test data signal TDI_SEL, the selected test mode state signal TMS_SEL, the selected test clock signal TCK_SEL, by means of the selection, as a function of the value of the processing enable signal EN_S, between the internal test signals TDI_EXT, TMS_EXT, TCK_EXT and the internal test signals TDI_INT, TMS_INT, TCK_INT generated internally by the driving circuit 50.

In particular, when the driving circuit 50 operates according to the external test mode, the selector 51 is configured to receive the external test signals TDI_EXT, TMS_EXT, TCK_EXT and is to receive the process enable signal EN_S having the low logic value indicative of the external test mode and is to generate over the first output terminal the selected input test data signal TDI_SEL equal to the external test data signal TDI_EXT. The selector 51 is also to generate over the second output terminal the selected test mode state signal TMS_SEL equal to the external test mode state signal TMS_EXT and is to generate over the third output terminal the selected test clock signal TCK_SEL equal to the external test clock signal TCK_EXT.

When the driving circuit 50 operates according to the internal test mode, the selector is to receive the internal test signals TDI_INT, TMS_INT, TCK_INT generated internally to the driving circuit 50, to receive the process enable signal EN_S having the high logic value indicative of the internal test mode, to generate over the first output terminal the selected input test data signal TDI_SEL equal to the internal test data signal TDI_INT, to generate over the second output terminal the selected test mode state signal TMS_SEL equal to the internal test mode state signal TMS_INT, and to generate over the third output terminal the selected test clock signal TCK_SEL equal to the internal test clock signal TCK_INT.

The programmable clock signal generator 57, the clock enable control module 58 and the clock gating 59 have the function of generating the internal test clock signal TCK_INT. In particular the programmable clock signal 57 is to receive, from the bus interface module 53, a programming signal CK_CFG having a variable value equal to the valued stored into the field TCK_DIV of the configuration register 64, to receive a reference clock signal CK_REF and is to generate a divided clock signal TCK_GEN having a frequency equal to the reference clock signal CK_REF divided by the value of the programming signal (therefore the divided clock signal TCK_GEN is synchronous with the reference clock signal CK_REF).

The clock enable control module 58 is configured to receive, from the control logic circuit 52, the clock control signal TCK_CT and, as a function thereof, and to generate a clock enable signal TCK_EN having a high logic value to enable the clock gating 59 and having a low logic value to disable the clock gating 59. The clock gating 59 is to receive the divided clock signal TCK_GEN, to receive the clock enable signal TCK_EN, and to generate the internal test clock signal TCK_INT equal to the divided clock signal TCK_GEN when the clock enable signal TCK_EN has the high logic value (therefore also the internal test clock signal TCK_INT is synchronous with the reference clock signal CK_REF), while it is configured to generate a null value when the clock enable signal TCK_EN has the low logic value.

Figure 3:
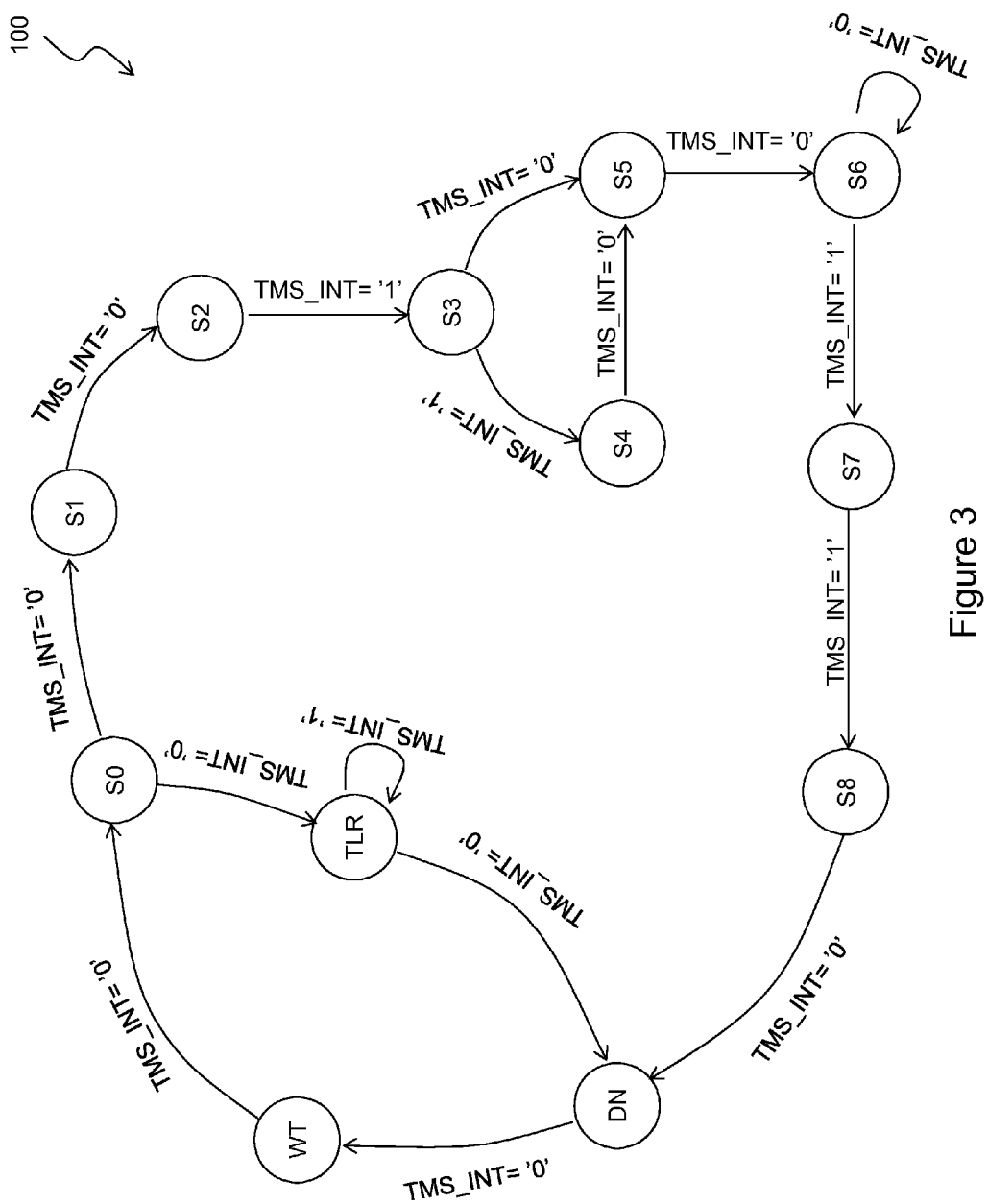
FIG. 3 schematically shows a finite state machine which implements the control logic circuit within the driving circuit according to an embodiment of the invention.

Advantageously, the control logic circuit 52 is implemented with a finite state machine 100, as schematically shown in FIG. 3, such to receive as an input the reference clock signal CK_REF and the stored command signal C_MEM and, as a function thereof and of the current state, it is to generate as an output one or more internal test signals (TDI_INT, TMS_INT, TCK_CT) used by the selector 51 to generate one or more selected test signals TDI_SEL, TMS_SEL, TCK_SEL.

Preferably, the finite state machine 100 is such to generate as output data used to carry out the write or read operations of the instruction register 31 (IR), of the boundary scan register 32 (BS) and of the by-pass register 33 (BP) of the Test Access Port 30, as defined in the standard IEEE 1149.1. In particular, the finite state machine 100 is to receive as an input the stored command signal C_MEM and, as a function thereof and of the current state, it is to generate as an output the internal clock control signal TCK_CT, to generate as an output the internal input test data signal. TDI_INT which carries the processed test commands (for example, the values to be written into the instruction register 31 or into the data registers 32, 33 of the Test Access Port 30), and it is to generate as an output the internal test mode state signal TMS_INT which has the function of causing a change of the state of the finite state machine 35 implemented into the Test Access Port 30 compliant to the standard IEEE 1149.1. For the sake of simplicity, it has to be observed that the finite state machine 100 shows on the arcs between the states only the generated value of the internal test mode state signal TMS_INT, whereas the values of the stored command signal C_MEM, of the internal input test data signal TDI_INT, of the internal clock control signal TCK_CT and the internal output test data signal TDO_INT are not shown.

In the case of the Test Access Port 30 according to the standard IEEE 1149.1, the finite state machine 100 comprises the following states. S0 is a starting state, wherein the finite state machine 100 is positioned when it is waiting to receive a high logic value of the reset field TST_LG_RST of the register 60. Moreover, it is the state wherein the finite state machine 100 is positioned when it is waiting to receive a high logic value of the starting field START_FSM and the one wherein the finite state machine 100 is positioned after the test command has been executed on the Test Access Port 30.

S1 is an intermediate state used to generate the internal test mode state signal TMS_INT. When the finite state machine 100 has a transition from state S0 to state S1, it is such to generate a low logic value (i.e. '0') of the internal test mode state signal TMS_INT. When the finite state machine 100 is such to remain into the state S1, it is such to keep the low logic value of the internal test mode state signal TMS_INT. S2 is an intermediate state used to generate the internal test mode state signal TMS_INT. When the finite state machine 100 has a transition from state S1 to state S2, it is such to generate a low logic value of the internal test mode state signal TMS_INT. When the finite state machine 100 is such to remain into the state S2, it is such to keep the low logic value of the internal test mode state signal TMS_INT.

S3 is an intermediate state used to generate the internal test mode state signal. When the finite state machine 100 has a transition from state S2 to state S3, it is such to generate a high logic value (i.e. '1') of the internal test mode state signal TMS_INT. S4 is an intermediate state used to generate the internal test mode state signal TMS_INT, to prepare the loading of the instruction register 31 of the Test Access Port 30. When the finite state machine 100 has a transition from state S3 to state S4, it is such to generate a high logic value of the internal test mode state signal TMS_INT. When the finite state machine 100 is such to remain into the state S4, it is such to keep the high logic value of the internal test mode state signal.

S5 is an intermediate state used to generate the internal test mode state signal TMS_INT, to prepare the loading of the data registers 32, 33 of the Test Access Port 30. When the finite state machine 100 has a transition from state S3 to state S5, it is such to generate a low logic value of the internal test mode state signal TMS_INT. When the finite state machine 100 has a transition from state S4 to state S5, it is such to generate a low logic value of the internal test mode state signal TMS_INT. When the finite state machine 100 is such to remain in state S5, it is such to keep the low logic value of the internal test mode state signal TMS_INT. S6 is a state used to generate the internal test mode state signal TMS_INT and in this state it occurs the serial loading of the instruction register 31 or of the data registers 32, 33 of the Test Access Port 30. When the finite state machine 100 has a transition from state S5 to state S6, it is such to generate a low logic value of the internal test mode state signal TMS_INT. When the finite state machine 100 is such to remain in state S6, it is such to keep the low logic value of the internal test mode state signal TMS_INT.

S7 is an intermediate state used to generate the internal test mode state signal TMS_INT. When the finite state machine 100 has a transition from state S6 to state S7, it is such to generate a high logic value of the internal test mode state signal TMS_INT. When the finite state machine 100 is such to remain in state S7, it is such to keep the high logic value of the internal test mode state signal TMS_INT. S8 is used to generate the internal test mode state signal TMS_INT. When the finite state machine 100 has a transition from state S7 to state S8, it is such to generate a high logic value of the internal test mode state signal TMS_INT. When the finite state machine 100 is such to remain in state S8, it is such to keep the high logic value of the internal test mode state signal TMS_INT.

ON is a state indicative of the completion of the execution of the test on the Test Access Port 30 and it is used to write the low logic value into the starting field START_FSM of the register 60 so that the micro-processor 10 is able to detect, by reading the low logic value of the starting field START_FSM, the completion of the execution of the test command on the Test Access Port 30. Moreover, it is used to write the low logic value of the reset field TST_LG_RST. When the finite state machine 100 has a transition from state S8 to state ON, it is such to generate a low logic value of the internal test mode state signal TMS_INT. WT is a stand-by state and it is used to reset some variables inside the control logic circuit 52. When the finite state machine 100 has a transition from state ON to state WT, it is such to generate a low logic value of the internal test mode state signal TMS_INT. When the finite state machine 100 has a transition from state WT to state S0, it is such to generate a low logic value of the internal test mode state signal TMS_INT.

TLR is a state wherein the Test Logic Reset sequence is generated, comprising 5 strokes of the internal test clock signal TCK_INT and of the internal test mode state signal TMS_INT having a high logic value. The finite state machine 100 is such to detect, by means of the stored command signals C_MEM, a transition from the low to the high logic value of the reset field TST_LG_RST of the command register 60, thus it is such to have a transition from state S0 to state TLR and it is such to generate a low logic value of the internal test mode state signal TMS_INT. The finite state machine 100 is such to remain into the state TLR wherein it is such to generate 5 strokes of the internal test clock signal TCK_INT and wherein it is such to generate the high logic value of the internal test mode state signal TMS_INT; moreover, it is such to generate the internal clock control signal TCK_CT which enables the clock enable control module 58 to generate a high logic value of the clock enable signal TCK_EN for five strokes of the internal clock signal TCK_INT. Subsequently, the finite state machine 100 has a transition from state TLR to state DN and it is such to generate a low logic value of the internal test mode state signal TMS_INT.

The different states S0 and S1 such to generate the low logic value of the internal test mode state signal TMS_INT allow to command correctly the finite state machine 35 of the Test Access Port 30, which may start from both state "Test Logic Reset" and state "Run Test Idle" (after one test cycle).

It has to be observed that in states S0, S1, S2, S3, S4, S5, S7, S8 the finite state machine 100 is to generate the internal clock control signal TCK_CT having a high logic value which enables the clock enable control module 58 to generate a high logic value of the clock enable signal TCK_EN, which enables the clock gating 59 which generates a rising edge of the internal test clock signal TCK_INT. In the state S6 the finite state machine 100 is to generate an internal clock control signal TCK_CT having a high logic value and thus the clock gating 59 is such to generate a number of subsequent and consequent rising edges of the internal test clock signal TCK_INT equal to the number of bits (stored into the field PULSE_NUM of the command register 60) to be serially loaded into the instruction register 31 or into one of the data registers 32, 33. In states DN and WT the finite state machine 100 is to generate the internal clock control signal TCK_CT having a low logic value and thus the clock gating 59 is such to generate an internal test clock signal TCK_INT having a low logic value.

It will be described hereinafter the operation of the system 1, also referring to FIGS. 1, 2 and 3. For the purpose of explaining the invention, the following hypothesis are considered the micro-processor 10 transmits over the bus BS a test command indicative of an operation to be carried out on the Test Access Port 30, wherein the test command is supposed to be a write operation of a value $IR_1$ into the instruction register 31 (IR) of the Test Access Port 30, where $IR_1$ denotes the type of instruction that the controller 35 of the Test Access Port 30 has to carry out (for example, an instruction EXTEST, SAMPLE/PRELOAD, BYPASS or INTEST). In addition, the finite state machine 100 generates the internal input test data signal TDI_INT compliant to the TDI (Test Data In) signal of standard IEEE 1149.1, it generates the internal test clock signal TCK_INT compliant to the TCK (Test Clock) signal of standard IEEE 1149.1, it generates the internal test mode state signal TMS_INT compliant to the TMS signal of standard IEEE 1149.1 and receives the selected output test data signal TDO_SEL compliant to the TDO (Test Data Out) signal of standard IEEE 1149.1.

The Test Access Port 30 is compliant to standard IEEE 1149.1 (wherein it is referred to as TAP=Test Access Port), thus it comprises the instruction register 31, the scan boundary register 32 and the by-pass register 33 and it implements the state machine defined in the standard IEEE 1149.1 comprising the states "Test Logic Reset", "Run Test Idle", "Select DR Scan", "Select IR Scan", "Capture DR", "Capture IR", "Shift DR", "Shift IR", "Exit 1 DR", "Exit 1 IR", "Update DR", "Update IR". Moreover, the Test Access Port 30 may include one or more additional data registers defined by the user with different functions defined by the user.

However, it has to be observed that the invention is not limited to the above hypothesis. Moreover, it has to be observed that the time instants $t_1, \ldots t_{15}$ are subsequent, also not consecutive, rising edges of the reference clock signal CK_REF.

It is supposed that at the starting instant $t_1$ the driving circuit 50 is in the stand-by mode and the digital circuit 40 is in the normal operation mode. At instant $t_2$ the micro-processor 10 transmits over the bus BS the pre-defined sequence of values in a pre-defined time order, the interface 53 receives the sequence of values and stores it into the protection registers 62, 63. The enable logic circuit 55 reads, by means of the sequence signal SEQ, the sequence of values stored into the protection registers 62, 63, it recognizes the sequence and generates the process enable signal EN_S having the high logic value indicating the activation of the internal test mode for the driving circuit 50 (and thus the selection from the inside of the system 1 of internal test signals TDI_TNT, TCK_INT, TMS_INT). The driving circuit 50 enters the internal test mode and the digital circuit 40 enters the normal operation test mode. The test modes are kept until instant $t_{14}$. The finite state machine 100 detects the transition from the low logic value to the high logic value of the process enable signal EN_S and it is positioned in the state S0. The process enable signal EN_S keeps the high logic value also at the subsequent instants $t_3 \ldots t_{15}$.

Moreover, the micro-processor 10 transmits over the bus BS a signal indicating the write operation of the value $IR_1$ into the instruction register 31 of the Test Access Port 30, wherein $IR_1$ indicates the type of instruction that the controller 35 of the Test Access Port 30 has to execute. In particular, the micro-processor 10 writes, by means of the signal transmitted over the bus BS, into the field INST1_DATA0 of the command register 60 the high logic value indicating a write operation into the instruction register 31, it writes into the field PULSE_NUM the number of bits required to represent the value $IR_1$ (i.e. the number of bits to be loaded into the instruction register IR 31), it writes into the data register 61 the value $IR_1$ and it writes into the starting field START_FSM the high logic value indicating the beginning of the execution of the write operation in the instruction register 31.

The finite state machine 100 detects, by means of the stored command signal C_MEM, the transition of the start field START_FSM of the command register 60 from the low logic value to the high logic value. The finite state machine 100 is positioned in the state S0 and it generates as an output the internal test mode state signal TMS_INT having a low logic value. Moreover, the finite state machine 100 generates the internal clock control signal TCK_CT having a high logic value which enables the clock enable control module 58, which enables the clock gating 59 which generates a rising edge of the internal test clock signal TCK_INT. In addition, the finite state machine 100 generates the internal input test data TDI_INT having a predefined value (e.g., all the bits equal to the low logic value).

The programmable clock signal generator 57 receives the reference clock signal CK_REF, receives the programming signal CK_CFG having a value stored into the field TCK_DIV of the configuration register 64 and it generates the divided clock signal TCK_GEN equal to the reference clock signal CK_REF divided by the value of the programming signal TCK_DIV.

The clock enable control signal 58 receives the internal clock control signal TCK_CT having the high logic value and it generates the clock enable signal TCK_EN having the high logic value which enables the clock gating 59.

The clock gating 59 receives the divided clock signal TCK_GEN, it receives the clock enable signal TCK_EN having the high logic value and it generates the internal test clock signal TCK_INT having a rising edge.

The selector 51 receives the process enable signal EN_S having the high logic value indicating the activation of the internal test mode for the driving circuit 50 (and thus the selection of the internal input test signals TDI_INT, TMS_INT, TCK_INT), it receives the internal test clock signal TCK_INT having a rising edge, it carries out the selection of the internal test signals TDI_INT, TMS_INT, TCK_INT and transmits as an output the selected input test data signal TDI_SEL, the selected test mode state signal TMS_SEL, the selected test clock signal TCK_SEL equal to the internal input test data signal TDI_INT, the internal test mode state signal TMS_INT, the internal test clock signal TCK_INT respectively. Therefore at instant $t_2$ the selected input test data signal TDI_SEL has the predefined value (for example, all the bits equal to the low logic value), the selected test mode state signal TMS_SEL has the low logic value, the selected test clock signal TCK_SEL has a rising edge.

The state machine 35 receives the selected test mode state signal TMS_SEL having the low logic value, it receives the selected test clock signal TCK_SEL having a rising edge and the state machine 35 moves to the state Test Logic Reset.

The Test Access Port 30 receives the selected input test data signal TDI_SEL having the predefined value (e.g. all the bits equal to the low logic value) and transmits the input scan data signal TDI_SCN equal to the selected input test data signal TDI_SEL. The output scan data signal TDO_SCN, the selected output test data signal TDO_SEL, the internal output test data signal TDO_INT and the test result register 65 have values which are disregarded (e.g. the terminal carrying the output scan data signal TDO_SCN is in a high-impedance condition).

At instant $t_3$ (subsequent to $t_2$) the finite state machine 100 has a transition from state S0 to state S1 and it generates as an output the internal test mode state signal TMS_INT having the low logic value.

The values of signals TCK_CT, TCK_EN, TCK_INT, TCK_SEL, TDI_INT, TDI_SEL, TDO_INT at instant $t_3$ are equal to those at instant $t_2$, so the selected test clock signal TCK_SEL has a rising edge and the selected test mode state signal TMS_SEL has the low logic value.

The state machine 35 receives the selected test mode state signal TMS_SEL having the low logic value, it receives the selected test clock signal TCK_SEL having a rising edge and the state machine 35 has a transition from state Test Logic Reset to state Run Test Idle.

The Test Access Port 30 receives the selected input test data signal TDI_SEL having the predefined value (e.g. all the bits equal to the low logic value) and transmits the input scan data signal TDI_SCN equal to the selected input test data signal TDI_SEL. The output scan data signal TDO_SCN, the selected output test data signal TDO_SEL, the internal output test data signal TDO_INT and the test result register 65 have values which are disregarded.

At instant $t_4$ (subsequent to $t_3$) the finite state machine 100 has a transition from state S1 to state S2 and it generates as an output the internal test mode state signal TMS_INT having the low logic value.

The values of signals TCK_CT, TCK_EN, TCK_INT, TCK_SEL, TDI_INT, TDI_SEL, TDO_INT at instant $t_4$ are equal to those at instant $t_2$, so the selected test clock signal TCK_SEL has a rising edge and the selected test mode state signal TMS_SEL has the low logic value.

The state machine 35 receives the selected test mode state signal TMS_SEL having the low logic value, it receives the selected test clock signal TCK_SEL having a rising edge and the state machine 35 remains the state Run Test Idle.

The Test Access Port 30 receives the selected input test data signal TDI_SEL having the predefined value (e.g. all the bits equal to the low logic value) and transmits the input scan data signal TDI_SCN equal to the selected input test data signal TDI_SEL. The output scan data signal TDO_SCN, the selected output test data signal TDO_SEL, the internal output test data signal TDO_INT and the test result register 65 have values which are disregarded.

At instant $t_5$ (subsequent to $t_4$) the finite state machine 100 has a transition from state S2 to state S3 and it generates as an output the internal test mode state signal TMS_INT having the high logic value.

The values of signals TCK_CT, TCK_EN, TCK_INT, TCK_SEL, TDI_INT, TDI_SEL, TDO_INT at instant $t_5$ are equal to those at instant $t_2$, so the selected test clock signal TCK_SEL has a rising edge and the selected test mode state signal TMS_SEL has the high logic value.

The state machine 35 receives the selected test mode state signal TMS_SEL having the high logic value, it receives the selected test clock signal TCK_SEL having a rising edge and the state machine 35 has a transition from state "Run Test Idle" to state "Select DR Scan".

The Test Access Port 30 receives the selected input test data signal TDI_SEL having the predefined value (e.g. all the bits equal to the low logic value) and transmits the input scan data signal TDI_SCN equal to the selected input test data signal TDI_SEL. The output scan data signal TDO_SCN, the selected output test data signal TDO_SEL, the internal output test data signal TDO_INT and the test result register 65 have values which are disregarded.

At instant $t_6$ (subsequent to $t_5$) the finite state machine 100 is positioned in the state S3 and reads, by means of the stored command signal C_MEM, the field INST1_DATA0 having the high logic value which indicates a write operation into the instruction register 31, then the finite state machine 100 performs a transition from state S3 to state S4 and it generates as an output the internal test mode state signal TMS_INT having the high logic value.

The values of signals TCK_CT, TCK_EN, TCK_INT, TCK_SEL, TDI_INT, TDI_SEL, TDO_INT at instant $t_6$ are equal to those at instant $t_2$, thus the selected test clock signal TCK_SEL has a rising edge and the selected test mode state signal TMS_SEL has the high logic value.

The state machine 35 receives the selected test mode state signal. TMS_SEL having the high logic value, it receives the selected test clock signal TCK_SEL having a rising edge and the state machine 35 has a transition from state "Select DR Scan" to state "Select IR Scan".

The Test Access Port 30 receives the selected input test data signal TDI_SEL having the predefined value (e.g. all the bits equal to the low logic value) and transmits the input scan data signal TDI_SCN equal to the selected input test data signal TDI_SEL. The output scan data signal TDO_SCN, the selected output test data signal TDO_SEL, the internal output test data signal TDO_INT and the test result register 65 have values which are disregarded.

At instant $t_7$ (subsequent to $t_6$) the finite state machine 100 has a transition from state S4 to state S5 and it generates as an output the internal test mode state signal TMS_INT having the low logic value.

The values of signals TCK_CT, TCK_EN, TCK_INT, TCK_SEL, TDI_INT, TDI_SEL, TDO_INT at instant $t_7$ are equal to those at instant $t_2$, so the selected test clock signal TCK_SEL has a rising edge and the selected test mode state signal TMS_SEL has the low logic value.

The state machine 35 receives the selected test mode state signal TMS_SEL having the low logic value, it receives the selected test clock signal TCK_SEL having a rising edge and the state machine 35 has a transition from state "Select IR Scan" to state "Capture IR".

The Test Access Port 30 receives the selected input test data signal TDI_SEL having the predefined value (e.g. all the bits equal to the low logic value) and transmits the input scan data signal TDI_SCN equal to the selected input test data signal TDI_SEL. The output scan data signal TDO_SCN, the selected output test data signal TDO_SEL, the internal output test data signal TDO_INT and the test result register 65 have values which are disregarded.

At instant $t_8$ (subsequent to $t_7$) the finite state machine 100 has a transition from state S5 to state S6, it reads, by means of the stored command signal C_MEM, into the field PULSE_NUM the number of bits and it reads into the data register 61 the first bit (for example, the least significant bit) of value $IR_1$, it generates as an output the internal test mode state signal TMS_INT having the low logic value and it generates as an output the internal input test data signal TDI_INT which carries the first bit of value $IR_1$.

The selector 51 receives the internal input test data signal TDI_INT which carries the first bit of value $IR_1$ and serially transmits the selected input test data signal TDI_SEL equal to the internal input test data signal TDI_INT.

The values of signals TCK_CT, TCK_EN, TCK_TNT, TCK_SEL at instant $t_8$ are equal to those at instant $t_2$, so the selected test clock signal TCK_SEL has a rising edge and the selected test mode state signal TMS_SEL has the low logic value.

The state machine 35 receives the selected test mode state signal TMS_SEL having the low logic value, it receives the selected test clock signal TCK_SEL having a rising edge and the state machine 35 has a transition from state "Capture IR" to state "Shift IR".

The Test Access Port 30 receives the selected input test data signal TDI_SEL which carries the first bit of value $IR_1$, it performs the shift of one position of the values stored into the instruction register 31, it transmits the value stored into the last flip flop (the one connected to the terminal carrying the selected output test data signal TDO_SEL) of the instruction register 31 over the selected output test data signal TDO_SEL and it writes the value into the bit at the position 0 of the internal output test data signal, finally it writes serially the first bit of value of $IR_1$ into the first flip flop (the one connected to the terminal carrying the selected input test data signal TDI_SEL) of the instruction register 31.

Moreover, the Test Access Port 30 transmits the input scan data signal TDI_SCN having the predefined value (for example, all the bit equal to the low logic value). The output scan data signal TDO_SCN has values which are disregarded.

At instant $t_9$ (subsequent to $t_8$) the finite state machine 100 remains in the state S6, it reads, by means of the internal variable stored at instant $t_6$, the number of bits to be loaded into the instruction register 31, it reads, by means of the stored command signal C_MEM, into the data register 61 the second bit of value $IR_1$, it generates as an output the internal test mode state signal TMS_INT having the low logic value and it generates as an output the internal input test data signal TDI_INT which carries the second bit of value $IR_1$.

The values of signals TCK_CT, TCK_EN, TCK_INT, TCK_SEL, TDI_INT, TDI_SEL, TDO_INT at instant $t_9$ are equal to those at instant $t_7$, thus the selected test clock signal TCK_SEL has a rising edge and the selected test mode state signal TMS_SEL has the low logic value.

The state machine 35 receives the selected test mode state signal TMS_SEL having the low logic value, it receives the selected test clock signal TCK_SEL having a rising edge and the state machine 35 remains in the state "Shift IR".

The Test Access Port 30 receives the selected input test data signal TDI_SEL which carries the second bit of value $IR_1$, performs the shift of one position of the values stored into the instruction register 31, it transmits the value stored into the last flip flop (the one connected to the terminal carrying the selected output test data signal TDO_SEL) of the instruction register 31 over the selected output test data signal TDO_SEL and it writes the value into the bit at the position 1 of the internal output test data signal TDO_INT, finally it writes serially the second bit of the value of $IR_1$ into the first flip flop (the one connected with the terminal carrying selected input test data signal TDI_SEL) of the instruction register 31.

The bus interface module 53 receives the internal output test data signal TDO_INT which carries the first and the second bits of the value of $IR_1$ and stores it into the test result register 65.

Moreover, the Test Access Port 30 transmits the input scan data signal TDI_SCN having the predefined value (for example, all the bits equal to the low logic value). The output scan data signal TDO_SCN has values which are disregarded.

The finite state machine 100 remains in the state S6 for a number of cycles of the reference clock signal CK_REF to write into the instruction register 31 the value $IR_1$ stored into the data register 61, i.e. for a number of cycles of the reference clock signal CK_REF equal to the value PULSE_NUM. Likewise the state machine 5 remains in the state "Shift IR" for the same number of cycles of the selected test clock signal TCK_SEL (equal to the internal clock signal TCK_INT) to write the value $IR_1$ into the instruction register 31. For the sake of simplicity, it is supposed PULSE_NUM=2 and it is supposed that the instruction register 31 has a dimension of 2 bits, thus 2 cycles of the reference clock signal OK_REF (at instants $t_7$, $t_8$) are sufficient to load the value $IR_1$ into the instruction register 31.

At instant $t_{10}$ (subsequent to $t_9$) the finite state machine 100 has a transition from state S6 to state S7 and it generates as an output the internal test mode state signal TMS_INT having the high logic value.

The values of signals TCK_CT, TCK_EN, TCK_INT, TCK_SEL, TDI_INT, TDI_SEL, TDO_INT at instant $t_{10}$ are equal to those at instant $t_2$, so the selected test clock signal TCK_SEL has a rising edge and the selected test mode state signal TMS_SEL has the high logic value.

The state machine 35 receives the selected test mode state signal TMS_SEL having the high logic value, it receives the selected test clock signal TCK_SEL having a rising edge and the state machine 35 has a transition from state "Shift IR" to state "Exit 1 IR".

The Test Access Port 30 receives the selected input test data signal TDI_SEL having the predefined value (for example, the bits equal to the low logic value) and transmits the input scan data signal TDI_SCN equal to the selected input test data signal TDI_SEL. The output scan data signal TDO_SCN, the selected output test data signal TDO_SEL, and the internal output test data signal TDO_INT have values which are disregarded.

At instant $t_{11}$ (subsequent to $t_{10}$) the finite state machine 100 has a transition from state S7 to state S8 and it generates as an output the internal test mode state signal TMS_INT having the high logic value.

The values of signals TCK_CT, TCK_EN, TCK_INT, TCK_SEL, TDI_INT, TDI_SEL, TDO_INT at instant $t_{11}$ are equal to those at instant $t_2$, thus the selected test clock signal TCK_SEL has a rising edge and the selected test mode state signal TMS_SEL has the high logic value.

The state machine 35 receives the selected test mode state signal TMS_SEL having the high logic value, it receives the selected test clock signal TCK_SEL having a rising edge and the state machine 35 has a transition from state "Exit 1 IR" to state "Update IR".

The Test Access Port 30 receives the selected input test data signal TDI_SEL having the predefined value (e.g. all the bits equal to the low logic value) and transmits the input scan data signal TDI_SCN equal to the selected input test data signal TDI_SEL. The output scan data signal TDO_SCN, the selected output test data signal TDO_SEL, and the internal output test data signal TDO_INT have values which are disregarded.

At instant $t_{12}$ (subsequent to $t_{11}$) the finite state machine 100 has a transition from state S8 to state DN and it generates as an output the internal test mode state signal TMS_INT having the low logic value. The internal test clock signal TCK_INT has a low logic value (and thus the selected test clock signal TCK_SEL has a low logic value) and the selected test mode state signal TMS_SEL has the low logic value.

The state machine 35 receives the selected test mode state signal TMS_SEL having the low logic value, it receives the selected test clock signal TCK_SEL having a predefined low logic value and the state machine 35 has a transition from state "Update IR" to state "Run Test Idle".

The Test Access Port 30 receives the selected input test data signal TDI_SEL having the predefined value (for example, all the bits equal to the low logic value) and transmits the input scan data signal TDI_SCN equal to the selected input test data signal TDI_SEL. The output scan data signal TDO_SCN, the selected output test data signal TDO_SEL, and the internal output test data signal TDO_INT have values which are disregarded.

Moreover, the finite state machine 100 writes into the starting field START_FSM of the command register 60 the low logic value which indicates the completion of the write operation of the instruction register 31. The micro-processor 10 detects, by means of the bus BS, the transition from the high logic value to the low logic value of the starting field START_FSM of the command register 60, then it reads the value stored into the test result register 65 and it checks whether it is equal to the expected value.

At instant $t_{13}$ (subsequent to $t_{12}$) the finite state machine 100 has a transition from state DN to state WT and it generates as an output the internal test mode state signal TMS_INT having the low logic value. The internal test clock signal TCK_INT has a low logic value (and thus the selected test clock signal TCK_SEL has a low logic value) and the selected test mode state signal TMS_SEL has the low logic value.

The state machine 35 receives the selected test mode state signal TMS_SEL having the low logic value, it receives the selected test clock signal TCK_SEL having the low logic value and the state machine 35 remains in the state "Run Test Idle".—The Test Access Port 30 receives the selected input test data signal TDI_SEL having the predefined value (for example, all the bits equal to the low logic value) and transmits the input scan data signal TDI_SCN equal to the selected input test data signal TDI_SEL. The output scan data signal TDO_SCN, the selected output test data signal TDO_SEL, and the internal output test data signal TDO_INT have values which are disregarded.

At instant $t_{14}$ (subsequent to $t_{13}$) the finite state machine 100 has a transition from state WT to state S0 and it generates as an output the internal test mode state signal TMS_INT having the low logic value. The internal test clock signal TCK_INT has a low logic value (and thus the selected test clock signal TCK_SEL has a low logic value) and the selected test mode state signal TMS_SEL has the low logic value.

The state machine 35 receives the selected test mode state signal TMS_SEL having the low logic value, it receives the selected test clock signal TCK_SEL having a low logic value and the state machine 35 remains in the state "Run Test Idle".—The Test Access Port 30 receives the selected input test data signal TDI_SEL having the predefined value (for example, all the bits equal to the low logic value) and transmits the input scan data signal TDI_SCN equal to the selected input test data signal TDI_SEL. The output scan data signal TDO_SCN, the selected output test data signal TDO_SEL, and the internal output test data signal TDO_INT have values which are disregarded.

At instant $t_{15}$ the test of the digital circuit 40 ends, thus the driving circuit 50 enters the stand-by mode and the digital circuit 40 enters the normal operation mode. Moreover, the finite state machine 100 generates the internal clock control signal TCK_CT having a low logic value. The programmable clock signal generator 57 receives the reference clock signal CK_REF, it receives the programming signal CK_CFG having a value stored into the field TCK_DIV of the configuration register 64 and it generates the divided clock signal TCK_GEN equal to the reference clock signal CK_REF divided by the value of the programming signal TCK_DIV. The clock enable control signal 58 receives the internal clock control signal TCK_CT having the low logic value and it generates the clock enable signal TCK_EN having the low logic value to disable the clock gating 59. The clock gating 59 receives the divided clock signal TCK_GEN, it receives the clock enable signal TCK_EN having the low logic value and it generates the internal test clock signal TCK_INT having a low logic value.

The operation in the case wherein the test command indicates a write operation of a value $DR_1$ into one of the data registers 32, 33 of the Test Access Port 30 is similar to that previously explained for the write operation of the instruction register 31, with the following differences.

At instant $t_6$ the finite state machine 100 is positioned in the state S3, it reads, by means of the stored command signal C_MEM, the field INST1_DATA0 having the low logic value which indicates a write operation into the data register 32, it reads the value stored into the field PULSE_NUM which indicates the number of bits to be loaded into the instruction register 31 and it stores the value into an internal variable, then the finite state machine 100 performs a transition from state S3 to state S5 and it generates as an output the internal test mode state signal TMS having a low logic value.

The state machine 35 receives the selected test mode state signal TMS_SEL having the low logic value, it receives the selected test clock signal TCK_SEL having a rising edge and the state machine 35 has a transition from state "Select DR" to state "Capture DR".

Instant $t_7$ is not present. At instant $t_8$ the finite state machine 100 has a transition from state S5 to state S6 and it has an operation similar to that disclosed above relating to instants $t_8$-$t_{15}$. Moreover, the finite state machine 35 of the Test Access Port 30 has an operation similar to that disclosed above relating to instants $t_8$-$t_{15}$, with the difference that the state "Shift IR" is replaced by state "Shift DR", state "Exit 1 IR" is replaced by state "Exit 1 DR" and the state "Update IR" is replaced by state "Update DR".

Moreover, the digital circuit 40 in the test mode switches from the shift register condition and the normal operation condition. Preferably, the driving circuit 50 further comprises a filter logic circuit 54 (IR_FLT) and a cyclic redundancy code controller 56 (CRC).

The filter logic circuit 54 has the function to filter the test commands stored into the bus interface module 53. In particular, the filter logic circuit 54 is such to read the test command stored into the command register 60, it is such to control whether the test command is included into a list of allowed test commands, and it is such to generate a test command enable signal EN_C having for example a high logic value to enable the selector 51 to perform the selection of the processed test command received from the control logic circuit 52 by means of the internal input test data signal TDI_TNT and having a low logic value to disable the selection. In this way it is possible to prevent the execution of determined test commands generated by the micro-processor 10. When the driving circuit 50 operates according to the internal test mode, the selector 51 is such to receive the internal input test data signal TDI_INT which carries the processed test command, it is such to receive the internal test mode state signal TMS_INT, it is such to receive the internal test clock signal TCK_INT, it is such to receive the process enable signal EN_S having a high logic value indicative of the activation of the internal test mode for the driving circuit 50 (and thus of the selection of the internal input test data signal TDI_INT), it is such to receive the test command enable signal EN_C and, in case the test command enable signal EN_C has a high logic value, the selector 51 is such to generate the selected input test data signal TDI_SEL which carries the processed test command, and, in case the test command enable signal EN_C has a low logic value, the selector 51 is such to generate the selected signals TDI_SEL, TMS_SEL, TCK_SEL having predefined values (for example, all equal to zero) indicative of the block of the test command.

Preferably, the micro-processor 10 generates the following sequence of values in a time interval comprised between $t_2$ and $t_3$. At instant $t_2$' a first pre-defined value KEY1 (represented for example by 32 bits) is written into the protection register 62 and the value zero is written into the protection register 63. At instant $t_2''$ (subsequent to $t_2'$) a second preset value KEY2 (represented for example by 32 bits) is written into the protection register 63, and at instant $t_2'''$ (subsequent to $t_2''$) the second preset value KEY2 is written into the protection register 62. At instant $t_2''''$ (subsequent to $t_2'''$) the first pre-defined value KEY1 is written into the protection register 62.

Preferably, the first pre-defined value KEY1 is (in hexadecimal base) d1c1c1a0 and the second pre-defined value KEY2 is (in hexadecimal base) d1caf0ca.

The cyclic redundancy code controller 56 has the function of performing the check of errors that may occur in the output scan data signal TDO_SON generated by the digital circuit 40, by means of a test scan signature calculated from the output scan data and compared with respect to an expected value. Advantageously, the test scan signature is a digital signature calculated with a cyclic redundancy code. Advantageously, the driving circuit 50 is able to manage more than one Test Access Port.

In addition, the driving circuit 50 is able to manage the write or read operation of the instruction register 31 or of the data registers 31, 32 of the Test Access Port 30 also in case wherein these registers have a dimension greater than the one of the data register 61 of the bus interface module 53. This is achieved by means of the configuration register 64, which further comprises a field LNG_SFT composed of one bit having a high logic value in case the dimension of the instruction register 31 (or of the data registers 31, 32) is greater than that of the data register 61. Moreover, the data to be written into the instruction register 31 or into the data registers 31, 32 (or to be read from the instruction register 31 or from the data registers 31, 32) are divided into a number of blocks of dimension equal to the dimension of the data register 61.

It is the object of the present invention also a method for driving a Test Access Port. The method comprises the steps of providing an input terminal for receiving a first test data signal, activating an internal test mode, generating a second test data signal carrying a test command to be executed on the test access port, processing the test command and generating therefrom an internal test data signal carrying the processed test command, generating a selected test data signal carrying the internal test data signal, and transmitting the selected test data signal.

Advantageously, the driving method further comprises the steps of receiving a sequence of values over a time interval, and checking if the received sequence of values is equal to an expected sequence of values. In case of a positive check, the method includes generating a process enable signal having a first value for indicating the activation of the internal test mode, performing the processing of the test command, and generating the selected test data signal carrying the internal test data signal.

That which is claimed:

1. A driving circuit for a test access port, the driving circuit comprising:
    an input configured to receive a first test data signal in an external test mode;
    another input configured to receive a second test data signal carrying a test command to be executed on the test access port when in an internal test mode;
    a control logic circuit configured to process the test command and to generate therefrom an internal test data signal carrying a processed test command in the internal test mode;
    a selector configured to generate a selected test data signal from the first test data signal when in the external test mode, and from the internal test data signal when in the internal test mode; and
    a first output configured to output the selected test data signal.

2. A driving circuit according to claim 1 further comprising an enable logic circuit configured to receive a sequence of values over a time interval, check if the received sequence of values is equal to an expected sequence of values, and in case of a positive check, generate a process enable signal having a first value for indicating activation of the internal test mode; wherein the control logic circuit is further configured to receive the process enable signal and perform the processing of the test command, in case of detecting the first value of the process enable signal; and wherein the selector is further configured to receive the process enable signal and generate the selected test data signal carrying the internal test data signal, in case of detecting the first value of the process enable signal.

3. A driving circuit according to claim 1 further comprising at least one command register configured to store the test command; and wherein the control logic circuit is further configured to read the test command from the command register.

4. A driving circuit according to claim 2, further comprising at least one protection register configured to store the received sequence of values; and wherein the enable logic circuit is further configured to read the stored sequence of values from the least one protection register.

5. A driving circuit according to claim 3, further comprising a filter logic circuit coupled between the at least one command register and the selector, the filter logic circuit being configured to:
    read the test command stored into the at least one command register;
    check if the read test command is included into a list of allowed commands;
    in case of a positive check, generate a test command enable signal for enabling the selector to perform the selection of the internal test data signal.

6. A driving circuit according claim 1, wherein the driving circuit is further configured to receive a reference clock signal, and wherein the driving circuit further comprises a generator configured to generate a divided clock signal from the reference clock signal; wherein the selector is further configured to generate a selected test clock signal carrying the divided clock signal when in the internal test mode; and wherein the driving circuit further comprises a second output terminal for transmitting the selected test clock signal.

7. A driving circuit according to claim 6, wherein the control logic circuit comprises a finite state machine configured to generate an internal test mode state signal; wherein the selector is further configured to generate a selected test mode state signal carrying the internal test mode state signal when in the internal test mode; and wherein the driving circuit further comprises a third output terminal configured to transmit the selected test mode state signal.

8. A driving circuit according to claim 7 wherein the test access port comprises an instruction register, and wherein the test command is a write operation of the instruction register.

9. A driving circuit according to claim 7 wherein the test access port comprises an instruction register, and wherein the test command is a read operation of the instruction register.

10. A driving circuit according to claim 7 wherein the test command is a read operation of the data register.

11. A system for testing a digital circuit, the system comprising:
a driving circuit for a test access port, the driving circuit comprising
an input configured to receive a first test data signal in an external test mode,
another input configured to receive a second test data signal carrying a test command to be executed on the test access port when in an internal test mode,
a control logic circuit configured to process the test command and to generate therefrom an internal test data signal carrying a processed test command in the internal test mode,
a selector configured to generate a selected test data signal from the first test data signal when in the external test mode, and from the internal test data signal when in the internal test mode, and
a first output configured to output the selected test data signal; and
a micro-processor configured to generate the second test data signal;
the test access port configured to receive the selected test data signal and execute the test command.

12. A system according to claim 11, wherein the system further comprises a digital circuit under test; wherein the test access port is further configured to generate an input scan data signal and to receive an output scan data signal in order to perform the test of the digital circuit; wherein the digital circuit is configured to receive the input scan data signal and to transmit the output scan data signal; and wherein the digital circuit is configured to operate in a normal condition or in a scan register condition when in the internal test mode.

13. A system according to claim 11 further comprising at least one command register configured to store the test command; and wherein the control logic circuit is further configured to read the test command from the command register.

14. A system according to claim 13, further comprising at least one protection register configured to store the received sequence of values; and wherein the enable logic circuit is further configured to read the stored sequence of values from the least one protection register.

15. An integrated circuit comprising a system for testing a digital circuit, the system comprising:
a driving circuit for a test access port, the driving circuit comprising
an input configured to receive a first test data signal in an external test mode,
another input configured to receive a second test data signal carrying a test command to be executed on the test access port when in an internal test mode,
a control logic circuit configured to process the test command and to generate therefrom an internal test data signal carrying a processed test command in the internal test mode,
a selector configured to generate a selected test data signal from the first test data signal when in the external test mode, and from the internal test data signal when in the internal test mode, and
a first output configured to output the selected test data signal;
a micro-processor configured to generate the second test data signal;
a test access port configured to receive the selected test data signal and execute the test command; and
a pin configured to receive the first test data signal.

16. An integrated circuit according to claim 15, wherein the test access port is further configured to generate an input scan data signal and to receive an output scan data signal in order to perform the test of a digital circuit; wherein the digital circuit is configured to receive the input scan data signal and to transmit the output scan data signal; and wherein the digital circuit is configured to operate in a normal condition or in a scan register condition when in the internal test mode.

17. An integrated circuit according to claim 15 further comprising at least one command register configured to store the test command; and wherein the control logic circuit is further configured to read the test command from the command register.

18. An integrated circuit according to claim 17, further comprising at least one protection register configured to store the received sequence of values; and wherein the enable logic circuit is further configured to read the stored sequence of values from the least one protection register.

19. A method for driving a test access port using a driving circuit comprising:
providing a first test data signal to an input of the driving circuit when in an external test mode;
providing a second test data signal to another input of the driving circuit, the second test data signal carrying a test command to be executed on the test access port when in an internal test mode;
processing the test command within the driving circuit and generating therefrom an internal test data signal carrying the processed test command in the internal test mode;
generating within the driving circuit a selected test data signal from the first test data signal when in the external test mode, and from the internal test data signal when in the internal test mode; and
outputting at a first output of the driving circuit the selected test data signal.

20. A method according to claim 19, further comprising:
receiving a sequence of values over a time interval;
checking if the received sequence of values is equal to an expected sequence of values;
in case of a positive check, generating a process enable signal having a first value for indicating the activation of the internal test mode, and performing the processing of the test command; and
generating the selected test data signal carrying the internal test data signal.

* * * * *